United States Patent
Hung et al.

(10) Patent No.: US 7,945,839 B2
(45) Date of Patent: May 17, 2011

(54) SET-CYCLIC COMPARISON METHOD FOR LOW-DENSITY PARITY-CHECK DECODER

(75) Inventors: Jui-Hui Hung, Tainan (TW); Jui-Hung Hung, Tainan (TW); Sau-Gee Chen, Hsinchu (TW)

(73) Assignee: National Chiao Tung University, Hsinchu (TW)

( * ) Notice: Subject to any disclaimer, the term of this patent is extended or adjusted under 35 U.S.C. 154(b) by 1051 days.

(21) Appl. No.: 11/742,499

(22) Filed: Apr. 30, 2007

(65) Prior Publication Data
US 2008/0244336 A1 Oct. 2, 2008

(30) Foreign Application Priority Data
Mar. 27, 2007 (TW) .............................. 96110555 A

(51) Int. Cl.
*H03M 13/00* (2006.01)
(52) U.S. Cl. .......................... 714/758; 714/781
(58) Field of Classification Search .................. 714/758, 714/781
See application file for complete search history.

(56) References Cited

U.S. PATENT DOCUMENTS

| 7,017,106 B2 | 3/2006 | Shen et al. | |
| 7,607,075 B2 * | 10/2009 | Blankenship et al. | 714/800 |
| 2007/0067696 A1 * | 3/2007 | Bhatt et al. | 714/758 |
| 2008/0065956 A1 * | 3/2008 | Blankenship et al. | 714/758 |
| 2008/0077839 A1 * | 3/2008 | Gross et al. | 714/755 |
| 2008/0222499 A1 * | 9/2008 | Hung et al. | 714/801 |

OTHER PUBLICATIONS

M. Karkooti, et al, Semi-parallel Reconfigurable Architectures For Real-Time LDPC Decoding. ITCC '04.

* cited by examiner

*Primary Examiner* — Joseph D Torres
(74) *Attorney, Agent, or Firm* — Muncy, Geissler, Olds & Lowe, PLLC

(57) ABSTRACT

The present invention discloses a set-cyclic comparison method for an LDPC (Low-Density Parity-Check) decoder, which applies to a CNU (Check Node Unit) or a VNU (Variable Node Unit). In the systematized method of the present invention, all the input elements are initialized to obtain a matrix. Based on the symmetry of the matrix and the similarity between the rows of the matrix are sequentially formed different sets respectively corresponding to the horizontally-continuous elements having the maximum iteration number in the horizontal and vertical directions, the symmetric non-continuous non-boundary elements, and the boundary elements plus the end-around neighboring elements in the same row. The present invention applies to any input number. Via the large intersection between the compared sets, the present invention can effectively reduce the number of comparison calculations and greatly promote the performance of an LDPC decoder.

7 Claims, 5 Drawing Sheets

SET-CYCLIC COMPARISON METHOD FOR LOW-DENSITY PARITY-CHECK DECODER

BACKGROUND OF THE INVENTION

1. Field of the Invention

The present invention relates to an algorithm for a decoder used in a transmission channel, particularly to a set-cyclic comparison method for an LDPC decoder.

2. Description of the Related Art

Distinct from general source coding, error control coding is used to restore as much as possible of the data damaged in transmission by the poor reliability of the transmission medium or the interference of external factors. Among error control codes, the low-density parity-check (LDPC) code is a promising and very useful coding technology.

An LDPC decoder may adopt a sum-product algorithm or a min-sum algorithm to perform decoding. The sum-product algorithm can reduce the complexity of calculation; however, it consumes more hardware resources. Thus, an LDPC decoder usually adopts the min-sum algorithm to reduce the complexity of hardware.

Refer to FIG. 1 a flowchart of the decoding process of an LDPC decoder. As shown in FIG. 1, the decoder is initialized firstly in Step S10; next, check nodes and bit nodes are respectively updated in Step S12 and Step S14; then, in Step S16, it is checked whether the iteration number of the data lists exceeds a predetermined maximum iteration number or whether the decoded information bits satisfies the check matrix constraint: $Hx^T=0$; if the result is positive, the decoded bits are output, and the process ends, as shown in Step S18; if the result is negative, the process returns to Step S12 to repeat the updates of the check nodes and the bit nodes.

The updates of the check nodes and the bit nodes are implemented with a check node unit (CNU) and a bit node unit (BNU). Therefore, CNU and BNU have great influence on the performance of the decoder. The conventional technologies cannot apply to a CNU with an arbitrary input number but can only get an optimal result for a specified input number. In the conventional technologies, the greater the input number, the more the comparison operations. Thus, the comparators need increasing, and the CNU operation speed slows down, and the performance of the decoder is degraded.

Accordingly, the present invention proposes a set-cyclic comparison method for an LDPC decoder to solve the above-mentioned problems.

SUMMARY OF THE INVENTION

The primary objective of the present invention is to provide a set-cyclic comparison method for an LDPC decoder, which is a systematized algorithm, and wherein via the large intersection between the compared sets, the number of comparison calculations is reduced, and the performance of the decoder is promoted.

Another objective of the present invention is to provide a set-cyclic comparison method for an LDPC decoder, which applies to any input number, and whereby CNU or VNU (Variable Node Unit) can work much faster, and the number of comparators can be effectively decreased, with the shortest critical path of the comparison operation maintained.

The set-cyclic comparison method of the present invention comprises the following steps: initializing the elements of a CNU or VNU having $N_{input}$ elements, sequentially removing the elements respectively at from the first position to the $N_{input}$th position to obtain $N_{input}$ pieces of lists to form a matrix with each list having ($N_{input}-1$) elements; searching the upper half of the matrix to find out the elements having the maximum iteration number $N_{iteration}$ in the horizontal and vertical directions to form a first-type set (H-V set) with the corresponding first-type set automatically presented in the lower half of the matrix; sequentially updating the dimensions of the first-type sets with the iteration number $N_{iteration}2=N_{iteration}1-1$ to repeatedly search for other first-type sets, determining whether $N_{iteration}2$ equals to zero, performing the succeeding step if the result is positive, and returning to the step of searching for the first-type sets if the result is negative; from the remnant elements not arranged into sets yet, adopting the continuous elements in the horizontal direction to form second-type sets (H sets), searching non-continuous elements to find out the symmetric non-boundary elements, and combining each symmetric non-boundary element with the most neighboring element thereof to form an extra second-type set; finding out the end-around neighboring elements in the same rows for the remnant boundary elements with $N_{row}2=N_{row}1+1$, combining each remnant boundary element with the end-around neighboring elements thereof to form a third-type set (H-C set); determining whether $N_{row}2$ equals to $N_{input}$, ending the process if the result is positive, and searching for the second-type sets again if the result is negative.

Below, the embodiments are to be described in detail in cooperation with the attached drawings to make easily understood the objectives, technical contents, characteristic and accomplishments of the present invention.

BRIEF DESCRIPTION OF THE DRAWINGS

FIG. 2 is a diagram schematically showing the architecture of an LDPC decoder the present invention may apply to;

DETAILED DESCRIPTION OF THE PRESENT INVENTION

The present invention pertains to a set-cyclic comparison method for an LDPC decoder, which effectively reduces the number of comparison operations via the large intersection between the compared sets without changing the shortest critical path of the comparison operation, and which can also fast work out the result for any input number.

Figure 1:
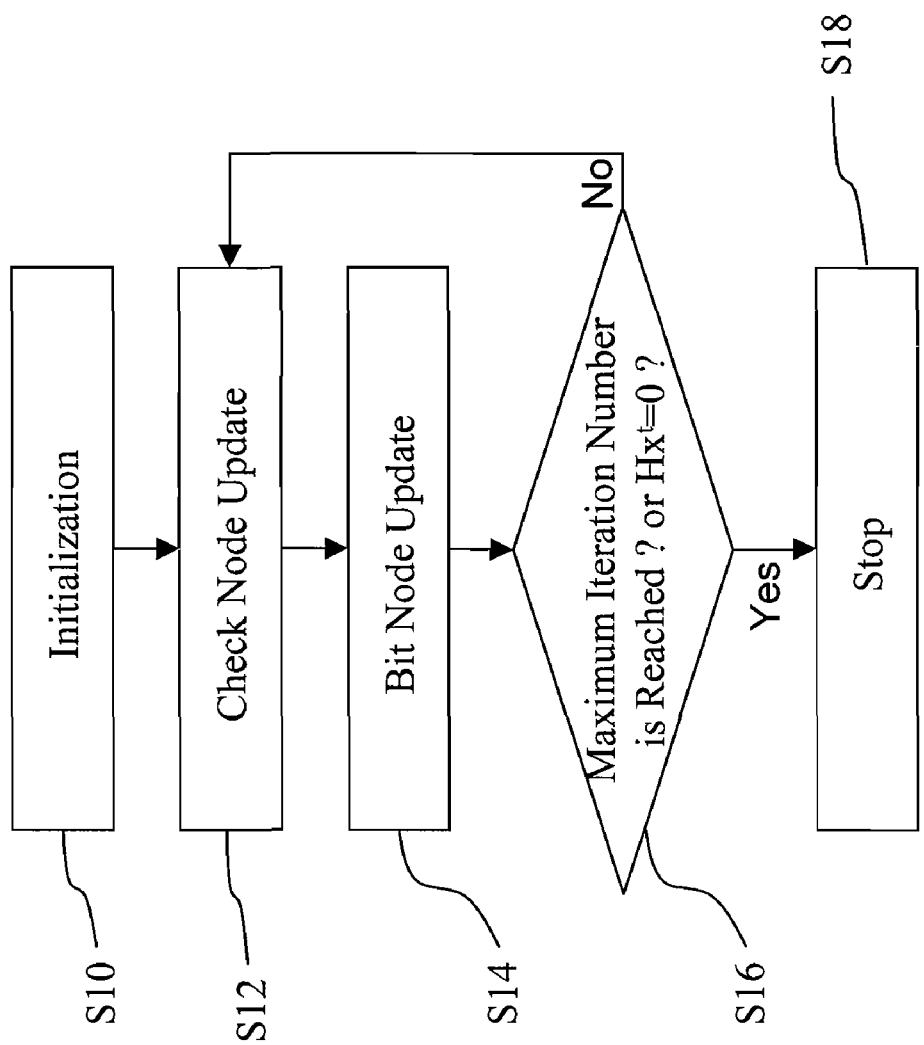
FIG. 1 is a flowchart of the decoding process of a conventional LDPC decoder.
Figure 2:
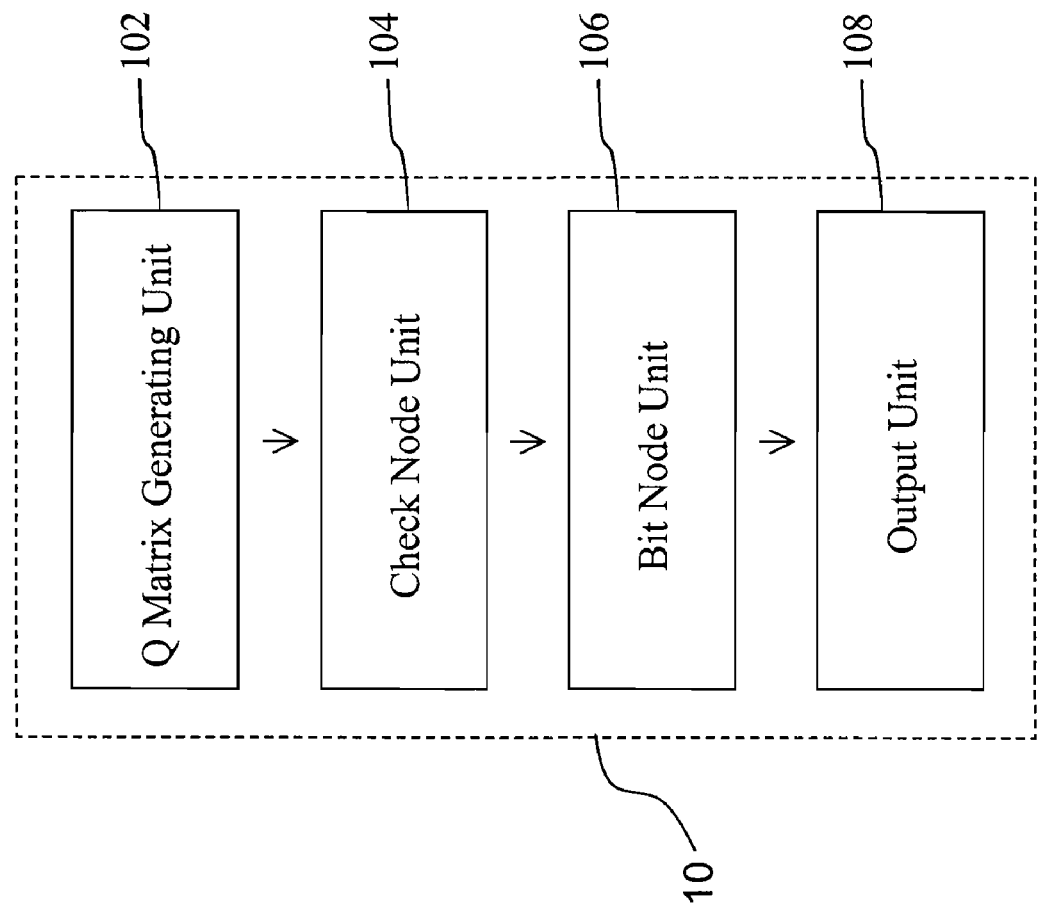

Refer to FIG. 2 a diagram showing the architecture of an LDPC decoder. The LDPC decoder comprises a Q matrix generating unit, a CNU (Check Node Unit), a BNU (Bit Node Unit) and an output unit. The set-cyclic comparison method of the present invention applies to an LDPC decoder, particularly to the CNU thereof. Further, the method of the present invention may also apply to a VNU (Variable Node Unit) having the characteristics similar to that of a CNU.

Figure 3:
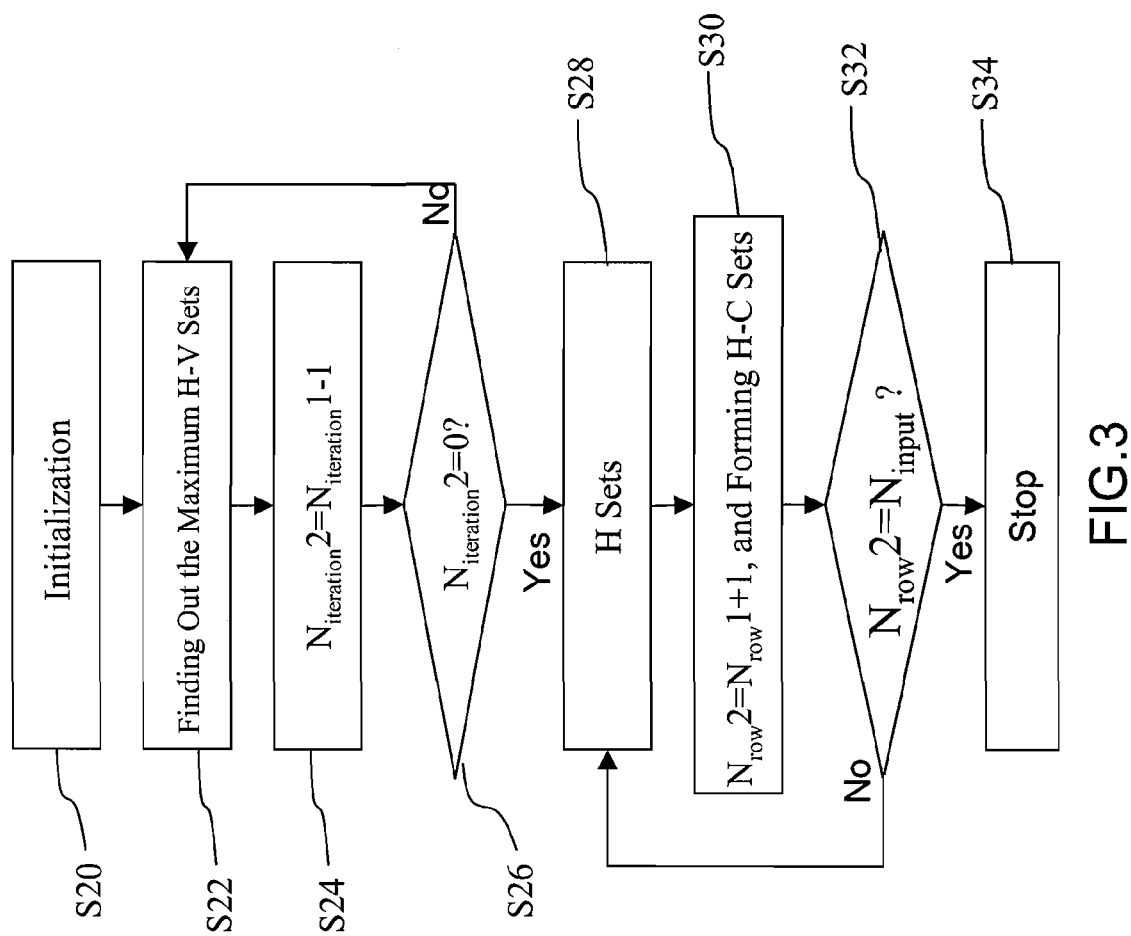
FIG. 3 is a flowchart of the process of the set-cyclic comparison method of the present invention.

Refer to FIG. 3 a flowchart showing the process of the set-cyclic comparison method of the present invention. The method of the present invention is based on matrix symmetry and row similarity and applies to a CNU/VNU with $N_{input}$ input elements.

In Step 20, the input elements are initialized, and the elements respectively at from the first position to the $N_{input}$th position are sequentially removed to obtain $N_{input}$ pieces of lists with each list having ($N_{input}$–1) elements; the lists are used to form a matrix M; the initial value of the variable of iteration number $N_{iteration}$ and the initial value of the variable of row calculation $N_{row}$ are respectively preset to be 1 and $\lceil \log_2(N_{input}-1) \rceil - 1$ with $N_{iteration}$ not identical to 0.

In Step 22, the upper half U of the matrix M is searched to find out the elements having the maximum iteration number $N_{iteration}$ in the horizontal and vertical directions to form the maximum first-type set (H-V set) having $2^{Niteration}$ elements; via the symmetry of the matrix M, the corresponding H-V set is automatically presented in the lower half L of the matrix M. In Step 24, the dimensions of the H-V sets are sequentially updated with the method that the iteration number $N_{iteration}2 = N_{iteration}1-1$, and searches are performed repeatedly for new H-V sets. In Step 26, it is determined whether $N_{iteration}$ equals to zero; if $N_{iteration}$ equals to zero, the succeeding Step 28 is performed; if $N_{iteration}$ does not equal to zero, the process returns to Step 22.

In Step 28, from the remnant elements not arranged into sets yet, the continuous elements in the horizontal direction are adopted to form second-type sets (H sets), i.e. an H set is formed in the $N_{row}$th row of the matrix M; non-continuous elements are searched to find out the symmetric non-boundary elements, and each symmetric non-boundary element is combined with the most neighboring element thereof to form an extra H set.

In Step 30, after the H sets have formed, searches are performed to find out the end-around neighboring elements in the same rows for the remnant boundary elements with $N_{row}2 = N_{row}1+1$, and each remnant boundary element is combined with the end-around neighboring elements thereof to form a third-type set (H-C set); thus, the remnant boundary element in the $N_{row}$th row of the matrix M is included in the calculation; if there is no element left, the succeeding step is performed.

In Step 32, it is determined whether $N_{row}2$ equals to $N_{input}$; if the result is positive, the process ends; if the result is negative, the process returns to Step 28.

The abovementioned H-V set (first-type set) contains $2^k$ elements, and k is an integer greater than 0, and the H-C set (third-type set) may also contain $2^k$ elements. Besides, the H-V sets (first-type sets), the H sets (second-type sets) and the H-C sets (third-type sets) may all have an even number of elements.

Figure 4:
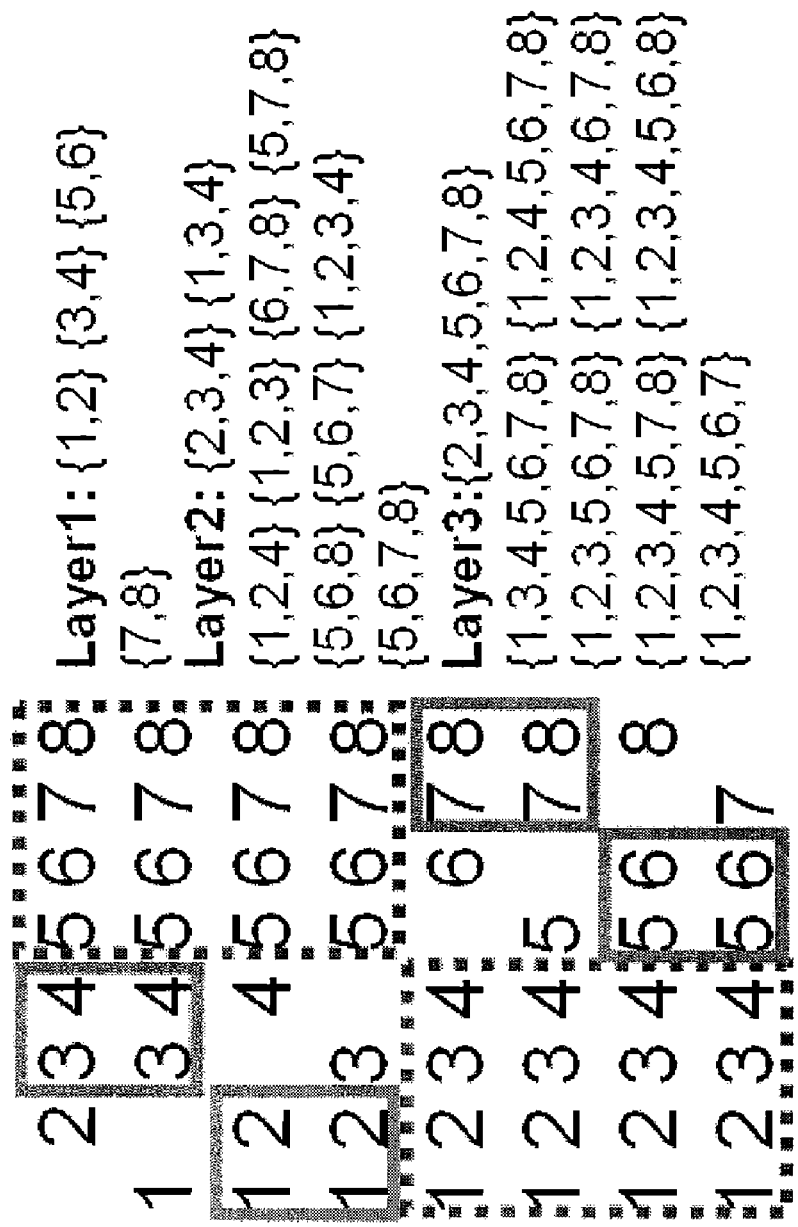
FIG. 4 is a diagram schematically showing that the present invention is applied to an 8-input set.
Figure 5:
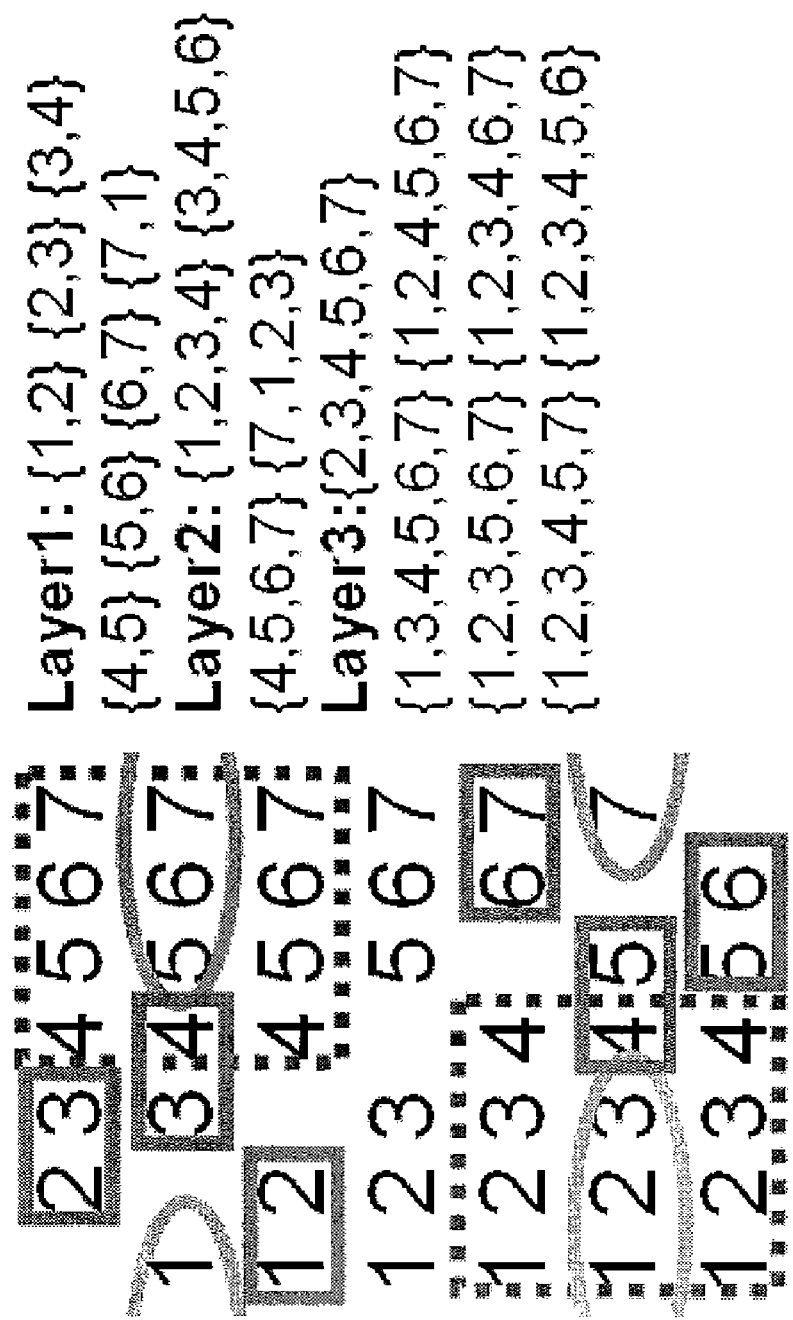
FIG. 5 is a diagram schematically showing that the present invention is applied to a 7-input set.

After the description of the principle, the embodiments shown in FIG. 4 and FIG. 5 are further used to exemplify the present invention.

Firstly, the formation of the H-V sets is described. Owing to the symmetry of the input matrix, the discussion will be limited to the upper half of the matrix from row 1 to row 3. Once the comparison operations of the center symmetry row (the fourth row) are automatically solved, the lower half from row 5 to row 7 can be treated similarly. Thus, the upper and lower parts of the matrix are solved. Initially, the algorithm finds out the intersection sets of the matrix M, which have the maximum value of the sharable compared results in the horizontal and vertical directions of the input matrix. To decrease the number of required comparators, each intersection set contains $2^k$ elements, and k is an integer greater than 0; such sets are called H-V sets. For example, in FIG. 4, the elements 5, 6, 7, and 8 enclosed by the dotted rectangle form the maximum initial H-V set. Owing to the symmetry, the elements 1, 2, 3, and 4 enclosed in the dotted rectangle symmetrical to the abovementioned rectangle form another identical-dimension initial H-V set. Next, the algorithm finds out the smaller-dimension H-V sets containing $2^{k-1}$ remnant elements, such as the sets included in Layer 1: the set {3, 4} in row 1 and row 2, the set {1, 2} in row 3 and row 4, the set {7, 8} in row 5 and row 6, and the set {5, 6} in row 7 and row 8.

After the formation of the abovementioned H-V sets, it is found that none sharable element can be used to form the H-V set in the vertical direction. Hence, only the remnant elements in the horizontal rows are used to form sharable sets. For example, in FIG. 4, each row has a remnant element, such as 2 in row 1. In such a case, one remnant element can integrate with the smallest-dimension H-V set to for an H set, for example, the set {2, 3, 4} in row 1. In FIG. 5, each row has two remnant elements; for example, elements 2 and 3, elements 1 and 3, elements 1 and 2 are respectively the remnant elements of row 1, row 2 and row 3. Hence, if two remnant in a row are continuous, the two remnant elements can be used to form an H set; for example, {2, 3} and {1, 2} are respectively the H sets in row 1 and row 3. Owing to symmetry, two H sets {5, 6} and {6, 7} are respectively formed in row 7 and row 5.

So far, in FIG. 5, only non-continuous elements are left; for example, elements 1 and 3 in row 2, elements 5 and 7 in row 6. Among the non-continuous elements, element 3 and element 5 are symmetric non-boundary elements and are respectively combined with the most neighboring elements thereof to form two extra H sets; thus, element 3 is combined with element 4 in row 2, and element 5 is combined with element 4 in row 6.

Finally, only the symmetric boundary non-continuous element 1 (in row 2) and element 7 (in row 6) are left to form H-C sets. One boundary non-continuous element is cyclically combined with the end-around neighboring elements in the same row to form a $2^k$-dimension H-C set. For example, element 1 in row 2 is combined with the end-around neighboring elements 5, 6 and 7 in the same row to form an H-C set {1, 7, 6, 5}; element 7 in row 6 is combined with the end-around neighboring elements 1, 2 and 3 in the same row to form an H-C set {7, 1, 2, 3}. Therefore, based on the symmetry of the matrix and the sharable sets containing the boundary remnant elements, only two input comparators are needed to achieve the objective.

In conclusion, the present invention proposes a systematized set-cyclic comparison method, which applies to any input number, wherein via the large intersection between the compared sets, the number of comparison calculations is effectively reduced, and whereby CNU or VNU can work much faster with the shortest critical path of the comparison operation maintained. Thus, the performance of the decoder is promoted.

Those described above are the embodiments to exemplify the present invention to enable the persons skilled in the art to understand, make and use the present invention. However, it is not intended to limit the scope of the present invention. Any equivalent modification or variation according to the spirit of the present invention is to be also included within the scope of the present invention.

What is claimed is:

1. A set-cyclic comparison method for a low-density parity-check decoder, which applies to a node unit with $N_{input}$ input elements, comprising the following steps:
   (a) initializing said elements, and sequentially removing said elements respectively at from a first position to $N_{input}$th position to obtain $N_{input}$ pieces of lists to form a matrix with each said lists having ($N_{input}$–1) said elements;
   (b) searching a upper half of said matrix to find out said elements having the maximum iteration number $N_{iteration}$ in a horizontal and vertical directions to form a first-type set with the corresponding said first-type set automatically presented in a lower half of said matrix;

(c) sequentially updating dimensions of said first-type sets with said iteration number $N_{iteration}2=N_{iteration}1-1$ to repeatedly search for other said first-type sets, determining whether said iteration number equals to zero, performing the succeeding Step (d) if the result is positive, and returning to Step (b) if the result is negative;

(d) from the remnant said elements not arranged into sets yet, adopting continuous said elements in the horizontal direction to form second-type sets, searching non-continuous said elements to find out symmetric non-boundary said elements, and combining each symmetric non-boundary said element with the most neighboring said element thereof to form an extra said second-type set;

(e) finding out end-around neighboring said elements in the same row for each remnant boundary said element with the row calculation variable $N_{row}2=N_{row}1+1$, combining each remnant boundary said element with the end-around neighboring said elements thereof to form a third-type set; and (f) determining whether $N_{row}2$ equals to $N_{input}$, ending the process if the result is positive, and returning to Step (d) if the result is negative.

2. The set-cyclic comparison method for a low-density parity-check decoder according to claim 1, wherein an initial value of said iteration number $N_{iteration}$ is set to be 1.

3. The set-cyclic comparison method for a low-density parity-check decoder according to claim 1, wherein an initial value of said row calculation variable $N_{row}$ is set to be $\lceil \log_2 (N_{input}-1) \rceil - 1$.

4. The set-cyclic comparison method for a low-density parity-check decoder according to claim 1, wherein said first-type set contains $2^k$ elements, and k is an integer greater than 0.

5. The set-cyclic comparison method for a low-density parity-check decoder according to claim 1, wherein said node unit is a check node unit or a variable node unit.

6. The set-cyclic comparison method for a low-density parity-check decoder according to claim 1, wherein said third-type set contains $2^k$ elements, and k is an integer greater than 0.

7. The set-cyclic comparison method for a low-density parity-check decoder according to claim 1, wherein each of said first-type sets, said second-type sets and said third-type sets has an even number of said elements.

* * * * *